(12) United States Patent
Chen et al.

(10) Patent No.: US 6,392,571 B1
(45) Date of Patent: May 21, 2002

(54) STRING SEARCH APPARATUS AND METHOD FOR DATA COMPRESSION

(75) Inventors: Chin-Long Chen, Fishkill; Vincenzo Condorelli, Poughkeepsie; Nihad Hadzic, Wappingers Falls; Douglas S. Search, Red Hook, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/852,893

(22) Filed: May 10, 2001

(51) Int. Cl.[7] .............................................. H03M 7/00
(52) U.S. Cl. ........................................ 341/60; 341/51
(58) Field of Search ........................... 341/51, 60, 106, 341/63, 76, 95

(56) References Cited

U.S. PATENT DOCUMENTS 5,003,307 A  3/1991  Whiting et al. ............... 341/51
6,240,213 B1 * 5/2001 Cho ............................ 341/51

OTHER PUBLICATIONS

"Data Compression Method Adaptive Coding with Sliding Window for Information Interchange," American National Standard Institute, ANSI X3.241–1994, pp. 1–8.

* cited by examiner

Primary Examiner—Brian Young
(74) Attorney, Agent, or Firm—Lawrence D. Cutter

(57) ABSTRACT

The present invention employs an extra array of character history matching storage flip flops wherein the extra set operates in an alternating sequence with the first set depending upon the occurrence of a character mismatch, to ensure that every character received by a data compressing system is treated and considered in the same clock cycle in which it is received. The resultant circuit and method provides a much more speedy and efficient method for compressing data and for preprocessing of data which is to be compressed.

21 Claims, 4 Drawing Sheets

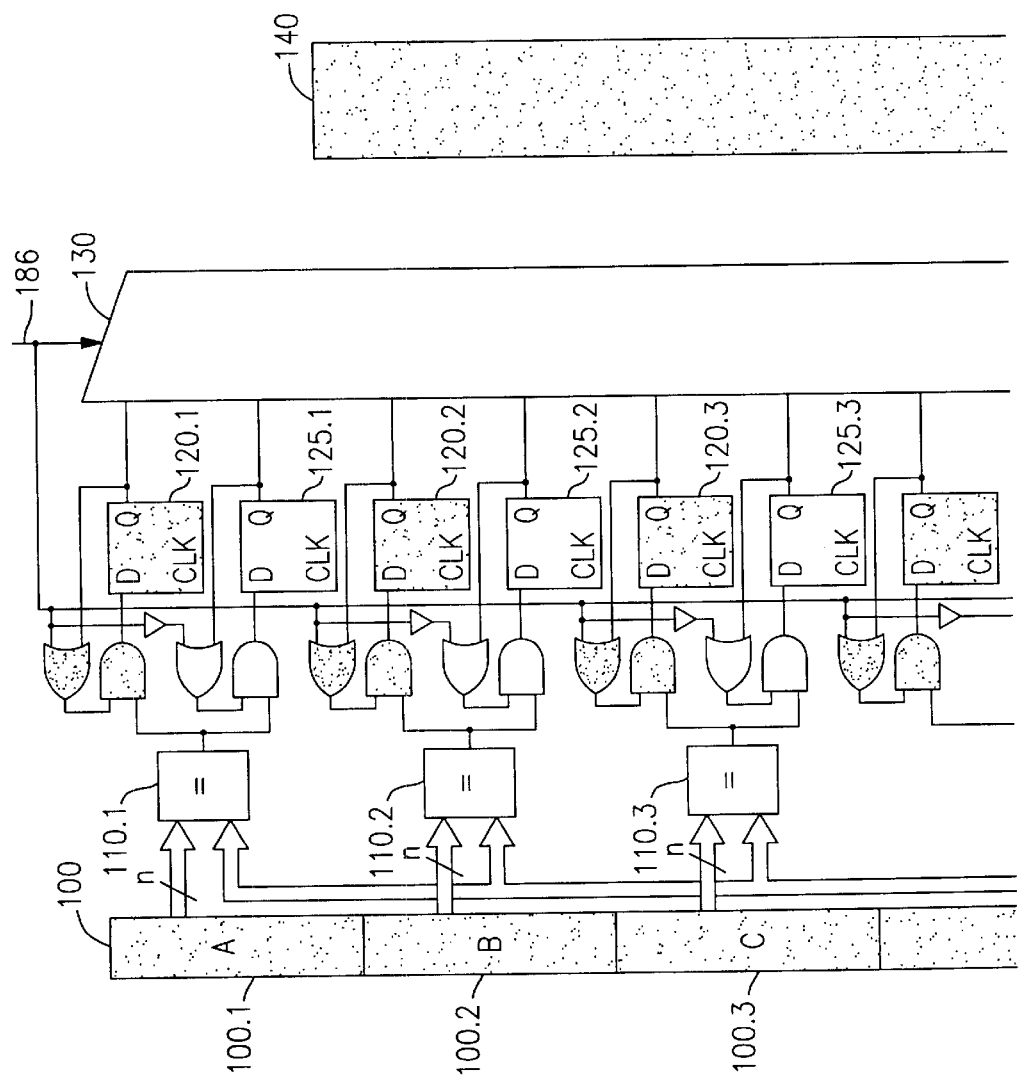

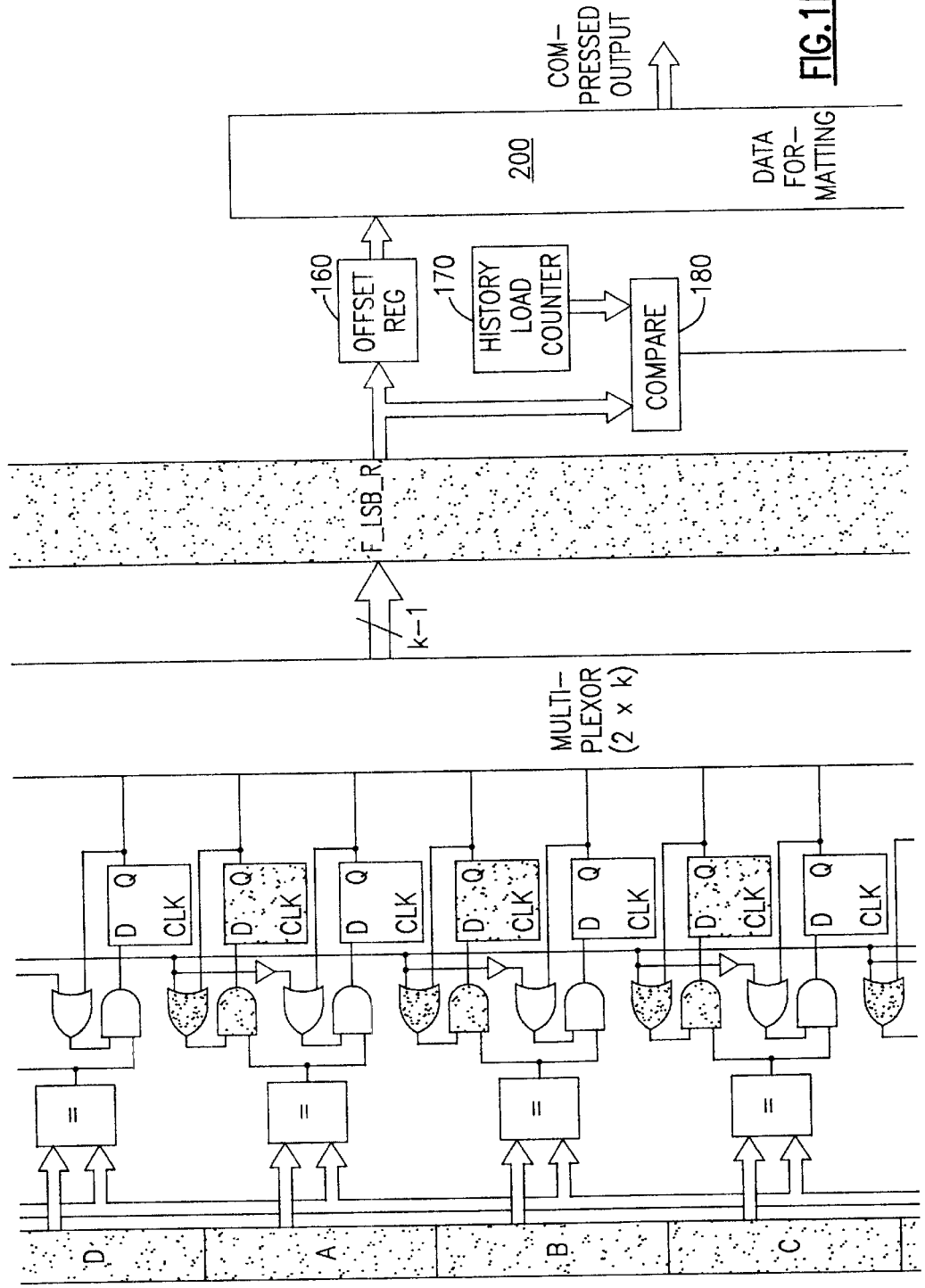

STRING SEARCH APPARATUS AND METHOD FOR DATA COMPRESSION

BACKGROUND OF THE INVENTION

The present invention is generally directed to systems and methods for compressing data. More particularly, the present invention is directed to a system and method for processing input character streams received by a data processing circuit or software-driven system. Even more particularly, the present invention is directed to a circuit and method for comparing input data stream characters so that even in the case of a character mismatch, character level processing still occurs in furtherance of data compression. In particular, processing occurs so as to eliminate timing and processing rate dependencies that occur as a result of variations in the input data stream. In particular, the present invention eliminates data compression processing rate dependencies which would normally occur due to the specific content of the received input data stream.

Data compression is a process which is carried out to reduce the number of bits of information that are employed to represent information in an input stream of characters. Data compression is possible because of the existence of certain patterns of information representation that occur in the input stream. In particular, certain strings of characters may appear in a plurality of locations within the data and it is sufficient to identify such repeated strings merely by their position within the stream. By taking advantage of such redundancies in the information flow, it is possible to represent the exact same information using fewer bits of data.

The importance of data compression arises for two primary reasons. Firstly, when data is represented in a compressed form, it takes less time to transmit this information from point A to point B. Secondly, data compression also permits the same data to be stored in fewer memory locations whether these memory locations be located in a random access memory or on a storage medium such as a magnetic disk drive, floppy disk, optical disk, or other fixed medium. Accordingly, compressed data is data that may be transmitted more quickly and stored more efficiently.

Additionally, data compression becomes that much more desirable when the implementing circuits and processes are fast and efficient. That is, if the data compression operation takes an undesirably long time, then at least one of the main benefits of data compression (time savings) is lost or at least negatively impacted. Accordingly, it is therefore desirable to be able to compress information in as rapid a fashion as possible.

The system and method of data compression enhancement described herein is applicable to any system or algorithm which employs mechanisms for locating and counting the length of character strings received which match already received character strings. Such systems are described in the American National Standard ANSI X.3.241-1994 titled "Data Compression Method—Adaptive Coding with Sliding Window for Information Interchange." The system descrived in the aforementioned standard, is also related to the data compression method shown in U.S. Pat. No. 5,003, 307. This patent describes a method for comparing each input character to any character already stored in a history buffer. This patent particularly describes one way of accumulating the result of data search in order to find the longest matching pattern. However, the data rate of the method described in the aforementioned patent is dependent upon the data received. If the data contains long repetitive patterns, the perforemance charactertics of the data compression engine are very good but they decline, however, as soon the matching patterns become short.

The reason for this performance dependency stems from the fact that each character in the received input stream is evaluated as a potential nth character of a matching character string. When n=1, this means that this is the start of a potential matching string. The compression algorithm described therein identifies each matching string of at least two characters. However, every time a mismatch is found, the accumulation logic that keeps track of the past search results is reset. In this case, the character that causes the mismatch is reevaluated as a starting character of a new string, as long as n is greater than 1. This activity causes a loss of one or two clock cycles per mismatch. It is thus clear that the data rate decreases with the number of mismatches. The present invention, however, does not suffer from this inadequacy.

SUMMARY OF THE INVENTION

In preferred embodiments of the present invention, each character from the received string of input characters is compared with all of the characters which have so far been received in the input stream. In addition, besides accumulating the result processing the current string, a comparison is also carried out as if the current comparison was the first character of a potential string that had not yet been identified in a match, that is, as a non-accumulated result. Thus, at each character input, a bifurcated set of data is stored. At those times that a mismatch is found, the additionally accumulated results are employed instead to evaluate the next character in the receiving input stream to determine whether or not this is the first character of a new (as yet unidentified) input string. By doing this, it is possible to process one character per clock cycle without any dependency on the data rate from the particular data pattern. The roles of the bifurcated stored results are reversed in this way whenever a mismatch occurs.

The present invention embodies several different aspects. In one aspect, it embodies a complete data compression engine. In another aspect, it embodies a preprocessing circuit for supplying data to a data compressing engine. In another aspect, the present invention is directed to a method for a processing input data sequences to relieve the data compression operation of dependence on specific data. And yet another aspect of the present invention is directed to a program product in which the described method is embodied in software.

Accordingly, it is an object of the present invention to provide an improved system and method for data compression.

It is a further object of the present invention to provide a method for data compression in which the speed of the compression is not as dependent upon data content as compared with prior approaches.

It is a still further object of the present invention to provide a circuit which performs preprocessing of data to efficiently generate string match, position, and length indications to data formatting mechanisms for producing compressed data output.

It is a yet another object of the present invention to eliminate problems that result when currently employed string data byte compare operations indicate a non-match.

It is a still further object of the present invention to provide a data compression system, method, and apparatus which are consistent with conventionally employed standards for data compression.

It is also an object of the present invention to provide an improved complete data compression engine.

Lastly, but not limited hereto, it is an object of the present invention to provide a data compression system and method for use with character strings of any fixed length.

The recitation herein of a list of desirable objects which are met by various embodiments of the present invention is not meant to imply or suggest that any or all of these objects are present as essential features, either individually or collectively, in the most general embodiment of the present invention or in any of its more specific embodiments.

DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1C:
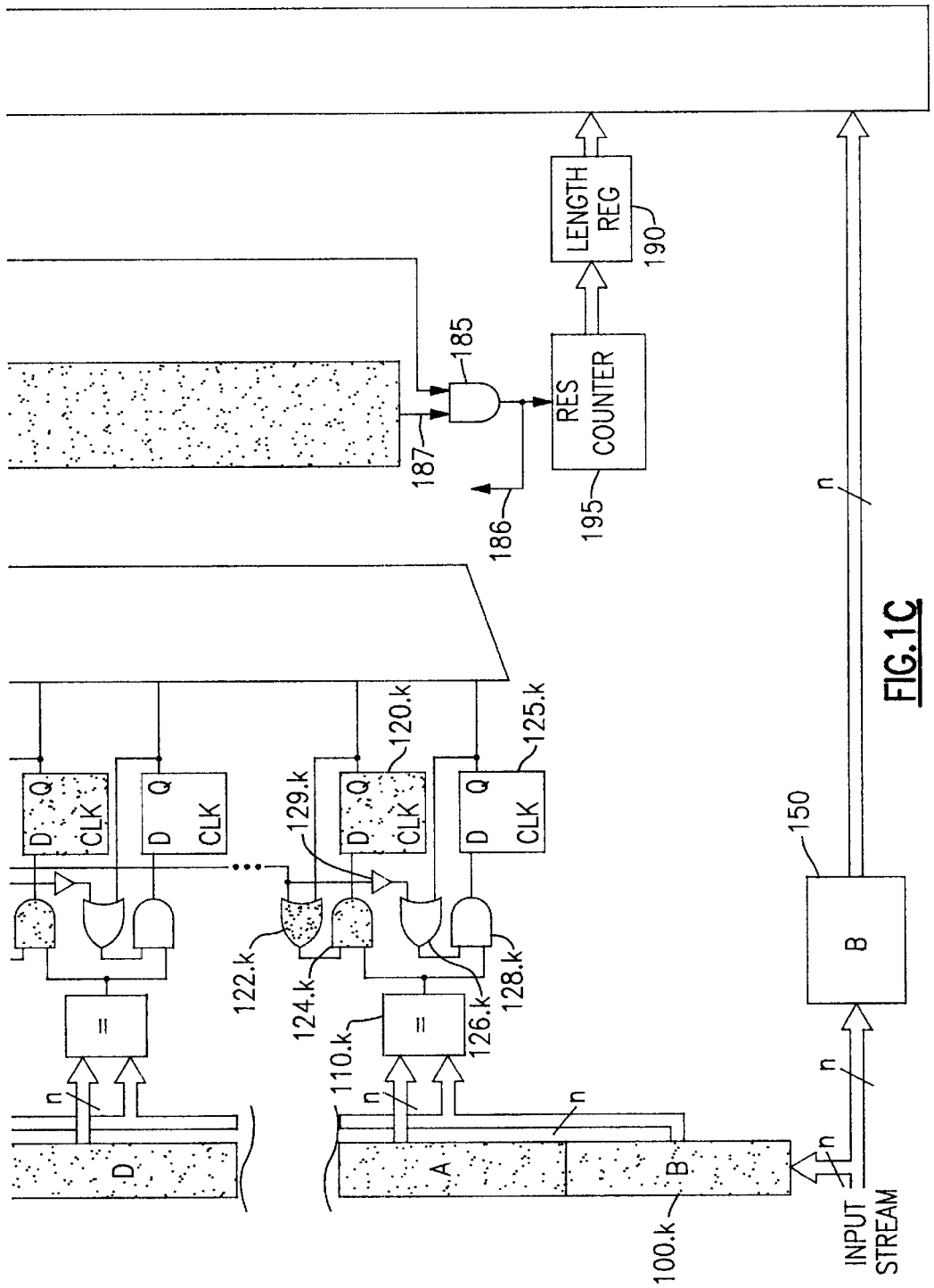
FIG. 1 is a block diagram of a circuit which implements the method of data compression in accordance with the present invention.

FIG. 1 illustrates a preferred embodiment of an apparatus for carrying out the present invention. In particular, it is seen that an input stream of character data is supplied simultaneously to first register 100.k in a shift register array 100 and simultaneously to register 150. The apparatus shown is clocked so that during each cycle of operation, a single n bit wide character is presented to shift register latch 100.k and latch 150. As subsequent data characters are presented to the circuit in binary form, the previously presented character is moved upward along shift register stack 100. Shift register stack 100 thus contains a running history of previously received input characters. The length of the history is finite, and the size of k is a tradeoff between cost and complexity versus efficiency and a size supported by the above-mentioned standard.

It is noted herein that the present application refers to a character as being n bit wide bites of data. In preferred embodiments of the present invention, n is eight and, correspondingly, it is then what is commonly referred to as a data "byte." For purposes of the present invention, a bite of data comprises n bits of information, where n is any reasonable number, typically either 8, or in the case that a character is one from a Unicode alphabet, 16.

Each shift register storage element 100.1 through 100.k is associated with a corresponding bit wise comparator 110.1 through 110.k, as shown. Each character position in shift register 100 is compared for equality with the most recently presented character intended to be used in the compression algorithm. The output of each comparator 100.1 through 100.k is a "1" if there is a match and "0" if there is no match.

The output signals from comparators 110.1 through 110.k are supplied to one of two arrays of storage elements. At any given time, one or the other of these arrays is the source of data to be compressed. Whether one or the other is operational for this purpose is controlled by toggled control line 186 so to receive the data as an input if in fact the present state of the storage element is already also a "1." It is noted that in operation, as characters are presented in the input stream in a sequence which matches a sequence which is already present in shift register 100, the first position where that match occurs is latched into one or the other of the two arrays of storage elements. A first array of such elements is designated by reference numerals 120.1 through 120.k as shown; a second set of storage elements are correspondingly labeled by reference numerals 125.1 through 125.k, also as shown. In preferred hardware embodiments of the present invention, these arrays of storage elements are implemented as clocked data flip flops.

Figure 2:
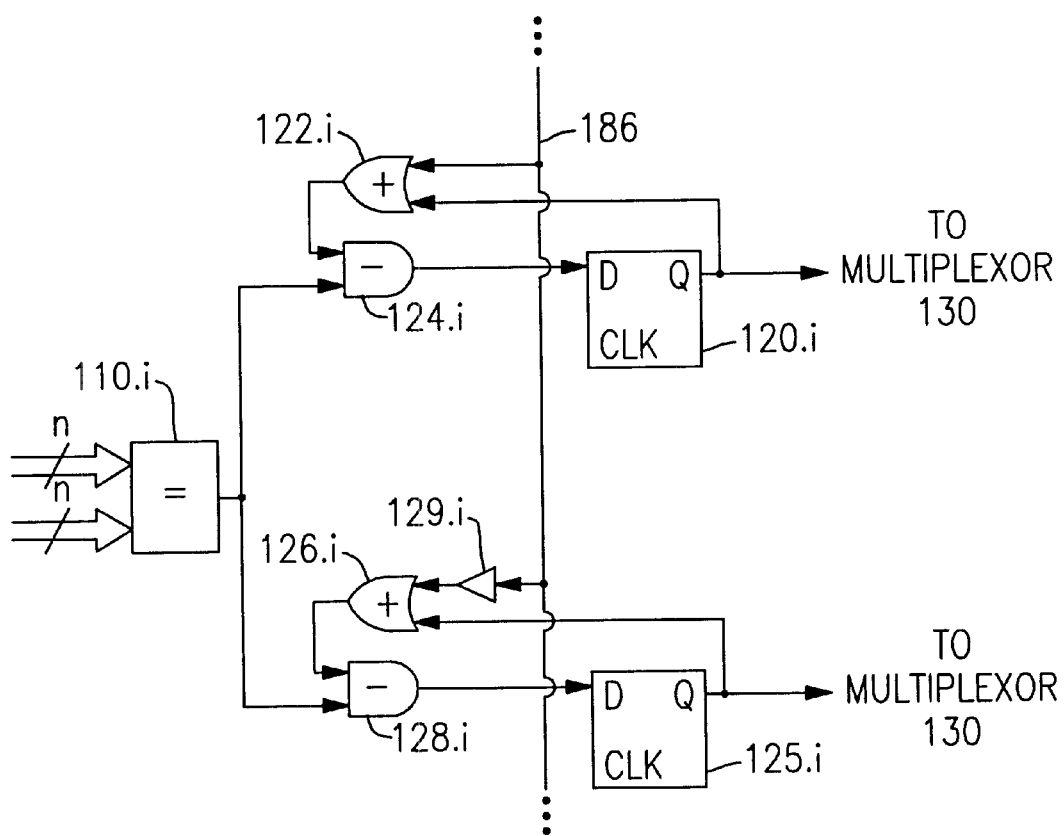
FIG. 2 is a block diagram of a portion of the circuit shown in FIG. 1 but now shown enlarged to provide a view which is easier to see and comprehend than the circuit shown in FIG. 1.

Using signal flow as a means to describe the operation of the present invention, it now becomes useful to discuss in more detail the operation of the pair of flip flops associated with each comparator element, which in turn is associated with a particular element within shift register 100. In particular, attention is directed to FIG. 2. In this regard, it is also important to observe that control line 186 is toggled back and forth between one state and another so that at any given time, one or the other of the arrays of flip flops (120 or 125) functions to store data that is produced by a corresponding comparator element 110.i. For purposes of labeling, it is noted that FIG. 2 is illustrative of the generic or $i^{th}$ element in the structure shown in FIG. 1.

It is particularly noted that signal line 186 is a toggled control line. It either permits or prohibits the use of the current state of flip flop 120.i or 125.i from being used as a mechanism for gating the writing of the current compare operation into the flip flop to replace the prior indication. Accordingly, signal line 186 is supplied to the first array of flip flops 120 through the set of OR-gates 122 (here represented by the single OR-gate 122.i). Because of the nature of the toggling operation, this signal line is supplied to OR-gate 126.i through inverter 129.i. Accordingly, other corresponding signals from control line 186 entering OR-gates 122.i and 126.i always have the opposite logic value. As long as toggled line 186 is a "1" or flip flop 120.i contains a "1," then AND-gate 124.i is permitted to write the output from comparator 110.i into flip flop (or storage element) 120.i. A corresponding mode of operation occurs for the second array of flip flops as exemplified by flip flop 125.i shown in FIG. 2. The operation here is exactly the same except that it occurs when signal control line 186 is in the "0" state. The output from storage elements 120.i and 125.i are both supplied to multiplexor 130 which is also controlled by toggled control line 186. In a first or "1" state, multiplexor 130 selects, as its output, the signal lines from the "lower" set of flip flops 120. When in its other state, signal control line 186 instructs multiplexor 130 to select the "upper" set of flip flops, namely, those in the array referred to by reference numerals 125.1 through 125.k. "Upper" and "lower" refer only to the pictorial arrangement shown in FIG. 1 and are not meant to imply any physical relationship.

In preferred embodiments of the present invention, there are 2,048 shift register latch elements in shift register 100. This number is preferred because it corresponds to the above-identified standard and also because it provides a convenient number to employ in terms of hardware implementations and in terms of data compression efficiency and performance. Since the first element of the shift register 100 is the one that is compared with the other elements, there are in fact only k−1 signals line which multiplexor 130 supplies to circuit 140.

The operation of circuit 140 is now more particularly described. In particular, this circuit performs an encoding function. It translates a position match indicator in the shift register to a binary address. In general, if k−1 bits are supplied to circuit 140, the output of circuit 140 comprises [log$_2$(k−1)] bits, where the brackets are used to denote "the smallest integer" which is greater than the number between the brackets. Thus, in preferred embodiments of the present invention, circuit 140 is provided with 2,047 signal lines and produces an encoded data position which is 11 bits in length. This is a direct consequence of the fact that $2^{11}$=2,048. Accordingly, in preferred embodiments of the present invention, an output of "00000000001" denotes a match with the first position in the shift register which for present purposes is the shift register latch immediately above the latch labeled 100.k in FIG. 1. Likewise, if the output of circuit 140 is "11111111111," then the match is indicated to be in the shift register latch labeled 100.1 in FIG. 1. This is a preferred encoding mechanism. In particular, it is preferred because it provides a very easy match between shift register latch position and a binary arithmetic representation of that position. However, it is noted that any unique form of encoding may be employed, as long as that encoding maps back to a position in the input stream of characters.

It is, however, noted that circuit 140 specifically selects for encoding that corresponding shift register latch position which occurs first. In this context "occurs first" means that the encoding is only performed for the shift register latch position which indicates the lowest position in FIG. 1. This is the so-called least significant position. The reason and necessity for this aspect of the functioning of circuit 140 is best understood when one considers that there may in fact be matches found at numerous points in the shift register latch. However, it is only the most recent match which matters in terms of the compression operation. In this respect, "most recent" means that particular shift register latch position which is lowest in the structure shown in FIG. 1. Accordingly, circuit 140 recognizes this latest match position and provides an appropriate encoding for that position. And in particular, as described above, this encoding is preferably one in which the binary output of circuit 140 is a binary number which directly matches a position indicator in shift register latch 100. This encoded position indication is supplied to offset register 160 whose output directly supplies data formatting engine 200 with position information.

In preferred embodiments of the present invention, it is not necessary to reset the contents of shift register latch 100 prior to receiving an input stream of data which is to be compressed. In particular, it is noted that if these latches were reset to a zero value, then an input stream of characters which did in fact represent zeros would not be properly compressed. In order to solve this problem, the system of FIG. 1 is provided with History Load Counter 170. This counter is reset to zero when a new input data stream is supplied to be compressed. History Load Counter 170 does not begin incrementing until the cycle when array element 100.k−1 is loaded with valid data. The reason for this is due to the fact that LSB circuit 140 receives as an input the output of flip-flop bank 120 or 125 which reflects what was in history buffer 100 in the previous cycle. History Load Counter 170 should therefore lag the count in history buffer 100 by one cycle. History Load Counter 170 therefore provides an indicator for the "address" or position of the highest most shift register latch position which is to be considered to be part of the compression operation. In particular, History Load Counter 170 provides an address cutoff beyond which shift register latch positions are discounted even if a character match is associated with these positions. Accordingly, the encoded address output from circuit 140 is compared with the contents of history load counter 170 in comparator 180. The output of comparator 180 is supplied to NAND-gate 185. Note that comparator 180 provides an A<B function, where A is the output from LSB circuit 140 and B is the output from History Load Counter 170. The other input to NAND-gate 185 is signal line 187 from circuit 140. In the event that all k−1 signal line 274 inputs to circuit 140 are "0" indicating a non-match condition, this signal line is turned off (that is, "0"). NAND-gate 185 acts as an inverted OR function in that if either input goes to "0," then a "1" on the output results. This causes the output of NAND-gate 185 to reset counter 195. When this does not occur, counter 195, like History Load Counter 170, is incremented by "1" at each cycle to reflect the number of character matches so far occurring. During each cycle, the output of counter 195 is supplied to length register 190 whose output is supplied to data formatting engine 200. Accordingly, it is seen that data formatting engine 200 receives three input signal lines: a position indication from offset register 160, a length indicator from register 190, and an indication of the most recently received character from register 150. This is all the information that a data formatting engine requires to produce compressed output signals. For example, an exemplary technique for such a compression is described in U.S. Pat. No. 5,003,307 issued Mar. 26, 1991, to Douglas L. Whiting et al. Column 6 of this patent is particularly enlightening with respect to data compression methods based upon the matching of received character strings, and the corresponding encoding of those strings to produce a compressed output sequence. Similar processes are illustrated in the above-described ANSI Standard.

From the above, it should be appreciated that the present invention provides an improved method and apparatus for matching character sequences found in data which is to be compressed. In particular, in accordance with the present invention, every time a mismatch is found, it is still nonetheless possible to evaluate the next character in the received input stream and accumulate the result with previous non-accumulated results. By doing this, it is possible to process one character per clock cycle without any data rate processing dependencies from the data rate which might result from particular data pattern sequences. It is therefore seen that the compression of data is accomplished much more rapidly and efficiently given the methods and systems disclosed herein.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for compressing binary strings of data received in n-bit wide bites of data, said method comprising the steps of:

comparing each said received bite of data with the so far received bite string to determine if said bite matches previously received bites, said bites being sequentially stored in a shift register having k storage positions which are n-bits in width;

during a first state of a toggled control line, setting a storage bit in a first k bit long storage array to indicate any positions in said so far received bite string for which continued matching of said received bites are indicated, said bit positions in said first storage array being associated with corresponding positions in said shift register;

during a second state of said toggled control line, setting a storage bit in a second k bit long storage array to indicate any positions in said so far received bite string for which continued matching of said received bites are indicated, said bit positions in said second storage array also being associated with corresponding positions in said shift register;

toggling said control line upon detection of the situation in which no match between said input bite and shift register positions corresponding to received bites has occurred;

encoding the output of one or the other of said arrays, depending on the state of said toggled control line, to produce an indication of position in said binary string where the most recent matched sequence of bites begins;

incrementing a counter every time said position indicator for a received bite is non-zero and transferring this count to a length register as each bite is received and processed; and providing said input bite, the contents of said length register, and said encoded position data to a data compressor which compresses data using such information.

2. The method of claim 1 in which n=8.

3. The method of claim 1 in which k=2,048.

4. A method for compressing binary strings of data received in n-bit wide bites of data, said method comprising the steps of:

comparing each said received bite of data with the so far received bite string to determine if said bite matches previously received bites, said bites being sequentially stored in a shift register having k storage positions which are n-bits in width;

during a first state of a toggled control line, setting a storage bit in a first k bit long storage array to indicate any positions in said so far received bite string for which continued matching of said received bite is indicated, said bit positions in said first storage array being associated with corresponding positions in said shift register;

during a second state of said toggled control line, setting a storage bit in a second k bit long storage array to indicate any positions in said so far received bite string for which continued matching of said received bite is indicated, said bit positions in said second storage array also being associated with corresponding positions in said shift register;

toggling said control line upon detection of the situation in which no match between said input bite and shift register positions corresponding to received bites has occurred;

encoding the output of one or the other of said arrays, depending on the state of said toggled control line, to produce an indication of position in said binary string where the most recent matched sequence of bites begins;

incrementing a counter every time said position indicator for a received bite is non-zero and transferring this count to a length register as each bite is received and processed; and producing a compressed variable length output data string based on said received bites, the contents of said length register and said encoded position data.

5. The method of claim 4 in which n=8.

6. The method of claim 4 in which k=2,048.

7. A method for compressing binary strings of data received in n-bit wide bites of data, said method comprising the steps of:

comparing each received bite of data with previously received characters in the string to produce a string position match indicator;

storing said position match indicator in a first storage location;

storing said position match indicator in a second storage location;

providing alternate ones of said position match indicators from said first and second storage locations in dependence on the occurrence of a non-match indication; and providing to a data compressor said received bite of data, alternating ones of said position match indicators and an indication of the length of sequentially matched bites, whereby every time a mismatch is found it is still possible to evaluate the next bite of data as if it were the start of a new matching string of data bites.

8. The method of claim 7 in which n=8.

9. A method for compressing binary strings of data received in n-bit wide bites of data, said method comprising the steps of:

comparing each received bite of data with previously received characters in the string to produce a string position match indicator;

storing said position match indicator in a first storage location;

storing said position match indicator in a second storage location;

providing alternate ones of said position match indicators from said first and second storage locations in dependence on the occurrence of a non-match indication; and producing a compressed variable length output data string based on said received bites, the number of sequential bite matches found and said alternating encoded position data, whereby every time a mismatch is found it is still possible to evaluate the next bite of data as if it were the start of a new matching string of data bites.

10. A method for preprocessing data received in a data stream of n-bit wide bites to be supplied to a data compressor, said method comprising the steps of:

comparing each received bite of data with previously received characters in the string to produce a string position match indicator and accumulating the result of this comparison for immediate use and also accumulating the result of said comparison for future use as if the current bite were the start of a new matching sequence of already received bites;

switching the roles of said immediate use indicators and said future use indicators upon the occurrence of no bite match being found; and providing alternate ones of said accumulated immediate and future comparison results to a data compressor.

11. A method for compressing data received in a data stream of n-bit wide bites to be supplied, said method comprising the steps of:

comparing each received bite of data with previously received characters in the string to produce a string position match indicator and accumulating the result of this comparison for immediate use and also accumulating the result of said comparison for future use as if the current bite were the start of a new matching sequence of already received bites;

switching the roles of said immediate use indicators and said future use indicators upon the occurrence of no bite match found;

providing alternate ones of said accumulated immediate and future comparison reallots to a data compressor; and producing a compressed variable length output data string based on said received bites, said alternating accumulated immediate and future comparison reallots, and the number of sequential bite matches found, whereby every time a mismatch is found it is still possible to evaluate the next bite of data as if it were the start of a new matching string of data bites.

12. A computer program product comprising computer readable media having program means thereon for data compression of bites in a received string of data comprising the process of:

comparing each received bite of data with previously received characters in the string to produce a string position match indicator and accumulating the result of this comparison for immediate use and also accumulating the result of said comparison for future use as if the current bite were the start of a new matching sequence of already received bites;

switching the roles of said immediate use indicators and said future use indicators upon the occurrence of no bite match being found; and providing alternate ones of said accumulated immediate and future comparison reallots to a data compressor.

13. An apparatus for preprocessing data received in a data stream of n-bit wide bites to be supplied to a data compressor, said apparatus comprising:

a shift register for storing a received sequence of data in n-bit wide bites;

a plurality of comparators, associated with a corresponding shift register location, for comparing a received bite of data with previously input bites stored in said shift register, and for providing an output indicative of said comparison;

a first array of storage locations, each of which is associated with a corresponding comparator, for storing the output of said comparators so as to reflect continued successful comparison matches associated with shift register locations;

a second array of storage locations, each of which is associated with a corresponding comparator, for storing the output of said comparators so as to reflect continued successful comparison matches associated with shift register locations;

a match detection circuit for detecting the occurrence of no match between a received bite of data and the portion of said shift register containing received said received bites;

a circuit for toggling between the operation of said first array and said second array in dependence on the output of said match detection circuit;

an encoder for mapping the output of one or the other of said arrays depending on the output of said toggling circuit, to produce an indication of position in said shift register where the most recent matched sequence of bites begins;

a multiplexor for selecting between the output of said first array and said second array and for supplying said selected output to said encoder; and a counter circuit for indicating the current number of sequential matches.

14. The apparatus of claim 13 in which said match detection circuit includes a history counter for counting said received bites to insure that comparisons with shift register positions that do not as yet correspond to received bites are ignored.

15. The apparatus of claim 13 in which said counter circuit comprises a comparison match counter and a length register for receiving the contents of said match counter.

16. The apparatus of claim 13 further including an offset register for storing the output of said encoder.

17. The apparatus of claim 13 in which n=8.

18. The apparatus of claim 13 in which there are 2,048 locations in said shift register.

19. An apparatus for compressing data received in a data stream of n-bit wide bites, said apparatus comprising:

a shift register for storing a received sequence of data in n-bit wide bites;

a plurality of comparators, associated with a corresponding shift register location, for comparing a received bite of data with previously input bites stored in said shift register, and for providing an output indicative of said comparison;

a first array of storage locations, each of which is associated with a corresponding comparator, for storing the output of said comparators so as to reflect continued successful comparison matches associated with shift register locations;

a second array of storage locations, each of which is associated with a corresponding comparator, for storing the output of said comparators so as to reflect continued successful comparison matches associated with shift register locations;

a match detection circuit for detecting the occurrence of no match between a received bite of data and the portion of said shift register containing received said received bites;

a circuit for toggling between the operation of said first array and said second array in dependence on the output of said match detection circuit;

an encoder for mapping the output of one or the other of said arrays depending on the output of said toggling circuit, to produce an indication of position in said shift register where the most recent matched sequence of bites begins;

a multiplexor for selecting between the output of said first array and said second array and for supplying said selected output to said encoder;

a counter circuit for indicating the current number of sequential matches; and a data compressor for producing a variable length compressed output stream based upon: said currently received bite, the output of said counter circuit and the output of said multiplexor.

20. The apparatus of claim 19 in which n=8.

21. The apparatus of claim 19 in which there are 2,048 locations in said shift register.

* * * * *